United States Patent
Zhu

(10) Patent No.: US 11,302,111 B2
(45) Date of Patent: Apr. 12, 2022

(54) FINGERPRINT SENSING DISPLAY PANEL AND FINGERPRINT SENSING METHOD

(71) Applicant: WUHAN CHINA STAR OPTOELECTRONICS SEMICONDUCTOR DISPLAY TECHNOLOGY CO., LTD., Wuhan (CN)

(72) Inventor: Qiwen Zhu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 395 days.

(21) Appl. No.: 16/472,375

(22) PCT Filed: Mar. 4, 2019

(86) PCT No.: PCT/CN2019/076801
§ 371 (c)(1),
(2) Date: Jun. 21, 2019

(87) PCT Pub. No.: WO2020/124792
PCT Pub. Date: Jun. 25, 2020

(65) Prior Publication Data
US 2021/0357607 A1 Nov. 18, 2021

(30) Foreign Application Priority Data
Dec. 21, 2018 (CN) .......................... 201811574046.9

(51) Int. Cl.
*G06F 3/00* (2006.01)
*G06V 40/13* (2022.01)
(Continued)

(52) U.S. Cl.
CPC ........ *G06V 40/1318* (2022.01); *G06F 3/0412* (2013.01); *G06F 3/0421* (2013.01); *H01L 27/3227* (2013.01)

(58) Field of Classification Search
CPC ... G06K 9/0004; G06F 3/0412; G06F 3/0421; H01L 27/3227
See application file for complete search history.

(56) References Cited

U.S. PATENT DOCUMENTS

| 6,888,571 B1 | 5/2005 | Koshizuka et al. |
| 2003/0020028 A1 | 1/2003 | Iihama et al. |

(Continued)

FOREIGN PATENT DOCUMENTS

| CN | 1322431 A | 11/2001 |
| CN | 1400666 A | 3/2003 |

(Continued)

*Primary Examiner* — Michael A Faragalla
(74) *Attorney, Agent, or Firm* — Osha Bergman Watanabe & Burton LLP

(57) ABSTRACT

A fingerprint sensing display panel includes a flexible substrate, a light sensing layer, a thin film transistor layer, an organic light-emitting diode layer, and a thin film encapsulation layer. The light sensing layer is disposed on the flexible substrate. Sensitivity of the light sensing layer set at high sensitivity. The organic light-emitting layer is disposed on the thin film transistor layer and configured to generate light according to an emitting signal from the thin film transistor layer. The thin film encapsulation layer is disposed on the organic light-emitting layer and configured to protect the organic light-emitting layer. When a user puts a finger on the fingerprint sensing display panel, the light sensing layer detects light generated from the organic light-emitting layer and reflected by the finger. By utilizing the fingerprint sensing display panel of the present disclosure, fingerprint recognition can be achieved without installing extra fingerprint recognizing components.

9 Claims, 2 Drawing Sheets

(51) Int. Cl.
*G06F 3/041* (2006.01)
*G06F 3/042* (2006.01)
*H01L 27/32* (2006.01)

(56) References Cited

U.S. PATENT DOCUMENTS

| | | | |
|---|---|---|---|
| 2018/0151639 | A1 | 5/2018 | Luo et al. |
| 2020/0074139 | A1* | 3/2020 | Zhou .................. H01L 27/3272 |
| 2020/0082142 | A1 | 3/2020 | Ye |

FOREIGN PATENT DOCUMENTS

| | | |
|---|---|---|
| CN | 107946346 A | 4/2018 |
| CN | 207182342 U | 4/2018 |
| CN | 108256409 A | 7/2018 |
| CN | 108768369 A | 11/2018 |
| CN | 108846392 A | 11/2018 |
| CN | 109034089 A | 12/2018 |

* cited by examiner

FINGERPRINT SENSING DISPLAY PANEL AND FINGERPRINT SENSING METHOD

FIELD OF INVENTION

The present invention relates to the field of display technologies, and in particular, to a display panel having an embedded fingerprint sensing sensor and a fingerprint sensing method.

BACKGROUND OF INVENTION

Fingerprint verification technology has been widely used due to rapid development of mobile communication technologies and smart terminals. Nowadays, a fingerprint recognition function becomes a standard function of smart terminals. Location of a fingerprint recognition device on the terminal and convenience become highly concerned. Integrating the fingerprint sensing function into a display area for enhancing user experience becomes an objective of the industry. Three kinds of fingerprint recognition that are currently applied to smart terminals are capacitive, optical, and ultrasonic recognition.

Optical fingerprint recognition mainly uses principles of light refraction and reflection. When a finger is placed on an optical lens, the finger is illuminated by an embedded light source emitted from bottom to the optical lens. Refracted angles from uneven lines on the surface of the finger and brightness of the reflected light will be different. Projecting the reflected light on a charge-coupled device through an optical lens to represent convexity (a marked line with a certain width and direction in a fingerprint image) in black and represent concavity (a recessed portion between the lines) in white in a digital multi-grayscale fingerprint image processed by algorithm of a fingerprint recognition device to complete the recognition by comparing the acquired multi-grayscale fingerprint image with a database.

Organic light-emitting diode (OLED) display technology utilizes an electric field to drive an organic semiconductor material and a luminescent material of a diode that illuminates by injection and recombination of a charge carrier. Flexible, large sized, and full-color display can be achieved because OLED display devices have advantages such as self-lamination, low driving voltage, high luminous efficiency, fast response times, high definition and high contrast, near 180° viewing angles, and wide operating temperature ranges. Therefore, the OLED display devices are recognized as the most promising display devices.

The most common fingerprint sampling method is installing a fingerprint identification component on a smart terminal. However, with development of a narrowed frame of touch display panels, a position to install the fingerprint identification component changes from a front edge to a back panel of a mobile phone for achieving a narrowed frame of the display panel. When the fingerprint identification component is disposed on the back panel, users have to put their fingers on the position of the fingerprint identification component to perform fingerprint recognition, which is less flexible in applications.

Therefore, the present disclosure provides a display panel and a fingerprint sensing method for fingerprint recognition and OLED display. In comparison with the existing fingerprint recognition functions of display devices, extra space for installing the fingerprint recognition sensor is not required anymore because fingerprint recognition can be implemented in the display area of the display panel.

SUMMARY OF INVENTION

The present disclosure provides a fingerprint sensing display panel includes a flexible substrate, a light sensing layer, a thin film transistor layer, an organic light-emitting diode layer, and a thin film encapsulation layer. The light sensing layer is disposed on the flexible substrate and is configured to adjust sensitivity of the light sensing layer according to a running application. The sensitivity of the light sensing layer is set at a high sensitivity when the running application requires fingerprint image sensing. The thin film transistor layer is disposed on the light sensing layer. The organic light-emitting layer is disposed on the thin film transistor layer and is configured to generate light according to an emitting signal from the thin film transistor layer. The thin film encapsulation layer is disposed on the organic light-emitting layer and is configured to protect the organic light-emitting layer. When a user puts a finger on the fingerprint sensing display panel, the light sensing layer detects light generated from the organic light-emitting layer and reflected by the finger. When the sensitivity of the light sensing layer is set at the high sensitivity, the light sensing layer detects concavity and convexity of the finger. When the sensitivity of the light sensing layer is set at a low sensitivity, the light sensing layer detects a location of the finger.

The present disclosure further provides a fingerprint sensing display panel includes a flexible substrate, a light sensing layer, a thin film transistor layer, an organic light-emitting diode layer, and a thin film encapsulation layer. The light sensing layer is disposed on the flexible substrate. The sensitivity of the light sensing layer is set at a high sensitivity when the running application requires fingerprint image sensing. The thin film transistor layer is disposed on the light sensing layer. The organic light-emitting layer is disposed on the thin film transistor layer and is configured to generate light according to an emitting signal from the thin film transistor layer. The thin film encapsulation layer is disposed on the organic light-emitting layer and is configured to protect the organic light-emitting layer. When a user puts a finger on the fingerprint sensing display panel, the light sensing layer detects light generated from the organic light-emitting layer and reflected by the finger.

Preferably, a sensitivity of the light sensing layer is adjusted according to a running application. The sensitivity of the light sensing layer is set at a high sensitivity when the running application requires fingerprint image sensing.

Preferably, the sensitivity of the light sensing layer is set at the high sensitivity, the light sensing layer detects concavity and convexity of the finger.

Preferably, a sensitivity of the light sensing layer is adjusted according to a running application. The sensitivity of the light sensing layer is set at a low sensitivity when the running application requires touch location sensing.

Preferably, when the sensitivity of the light sensing layer is set at the low sensitivity, the light sensing layer detects a location of the finger.

The present disclosure further provides a fingerprint sensing method utilized on a fingerprint sensing display panel. The fingerprint sensing display panel comprising a light sensing layer, an organic light-emitting layer, and a thin film encapsulation layer. The fingerprint sensing method includes step one to three. Step one: determining a running application requiring a fingerprint image or touch location of the display panel. Step two: adjusting a sensitivity of the light sensing layer according to the running application. Step three: detecting intensity of light generated from the organic light-emitting layer, penetrating through the thin film encapsulation layer, and reflected from a finger of a user, wherein the light sensing layer detecting an image of the finger putting on the display panel when the sensitivity of the light sensing layer is set at a high sensitivity, the light sensing layer detecting a location of the finger putting on the display panel when the sensitivity of the light sensing layer is set at a low sensitivity.

Preferably, the sensitivity of the light sensing layer is set at the high sensitivity if the running application requires fingerprint image detections, the sensitivity of the light sensing layer is set at the low sensitivity if the running application requires finger location detections Preferably, the sensitivity of the light sensing layer is set at the high sensitivity, the light sensing layer detects a concavity and a convexity of the finger of the user according to the intensity of the light reflected from the finger Preferably, the sensitivity of the light sensing layer is set at the low sensitivity. The light sensing layer detects the location of the finger of the user according to the fi the light reflected from the finger.

Preferably, the step one further includes detecting whether the user puts the finger on the thin film encapsulation layer, determining a running application requiring a fingerprint image or touch location of the display panel if the finger is detected on the thin film encapsulation layer, the sensitivity of the light sensing layer is set at the low sensitivity if the finger is not detected on the thin film encapsulation layer.

The advantage of the present disclosure is the sensitivity of the light sensing layer can be adjusted according to the running application of the display panel by utilizing the fingerprint sensing display panel of the present disclosure. Therefore, the light sensing layer can detect the position where the touch occurs and the fingerprint image on the display panel. Fingerprint recognition can be achieved without extra space for fingerprint recognition components.

DETAILED DESCRIPTION OF PREFERRED EMBODIMENTS

The fingerprint sensing display panel and the fingerprint sensing device provided by the present disclosure will be described in detail below with reference to the accompanying drawings. It is obvious that the described embodiments are only a part, not all, of the embodiments of the invention. All other embodiments obtained by a person of ordinary skill in the art based on the embodiments of the present disclosure without creative efforts are within the scope of the present disclosure.

Figure 1:
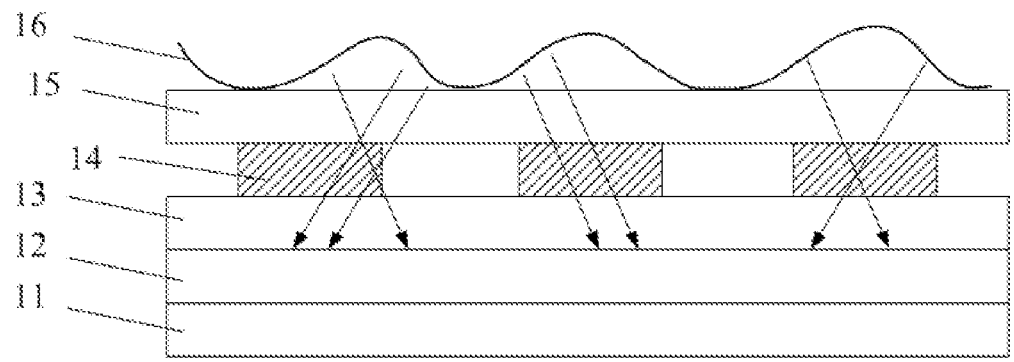
FIG. 1 illustrates a structure of a fingerprint sensing display panel of the present disclosure.

Please refer to FIG. 1, which illustrates a structural view of a display panel having an optical fingerprint recognition function. A display panel 10 includes a flexible substrate 11, a light sensing layer 12, a thin-film transistor (TFT) layer 13, an organic light-emitting diode (OLED) layer 14, and a thin film encapsulation (TFE) layer 15. Users put their fingers on the TFE layer 15 to perform touch or fingerprint recognition. When the users press their fingers on the display panel, light generated by the OLED layer will be reflected by a fingerprint image 16 and then diffused to the light sensing layer 12. The flexible substrate 11 is disposed on a glass substrate (not shown). The flexible substrate 11 can be made from flexible materials such as polyimide (PI) or metal. After the flexible substrate 11 is formed, sequentially disposing the light sensing layer 12, the TFT layer 13, the OLED layer 14, and the TFE layer 15.

In the existing OLED display panel, the light generated by the OLED light-emitting layer is reflected when it faces an object. When the light sensing layer of the OLED display panel receives the reflected light, the detected light intensity is detected so that whether the touch occurs, the location where the touch occurs, and the movement direction of the touch can be obtained. The features of the present disclosure are to enhance the sensitivity of the light sensing layer, which is originally utilized to detect touch, using the light sensing layer used to detect the touch in the OLED display panel so that the light sensing layer can distinct convexity and concavity of fingerprints according to the reflected light intensity. Therefore, fingerprint recognition can be achieved.

Figure 2:
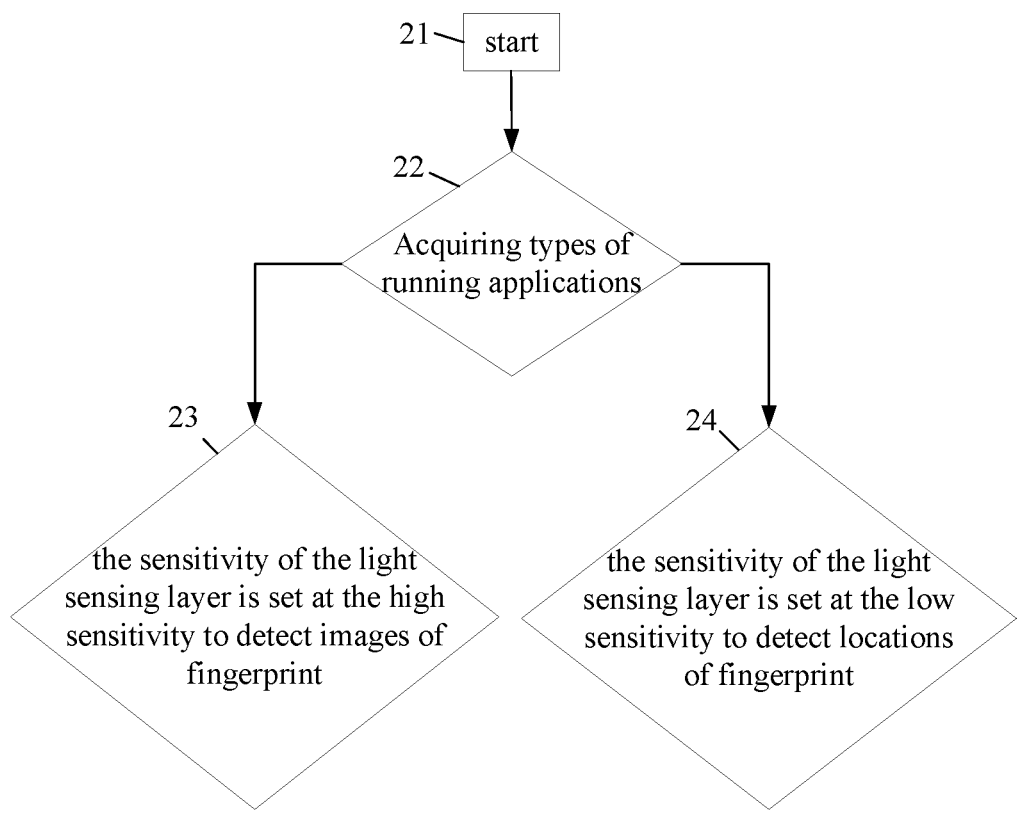
FIG. 2 illustrates a flow chart of the fingerprint sensing display panel of a first embodiment of the present disclosure.

Please refer to FIG. 2. FIG. 2 is a flow chart of the fingerprint sensing display panel of a first embodiment of the present disclosure. In step 21, a terminal having a fingerprint sensing display panel of the present disclosure launches and displays images on a screen according to running applications or user instructions. In step a 22, the terminal determines whether the running application displayed on the display panel requires fingerprint recognition or not. If the running application requires fingerprint recognition, a step 23 is performed. If the running application does not require fingerprint recognition, a step 24 is performed. In the step 23, when the running application requires fingerprint recognition, the terminal arises the sensitivity of the light sensing layer, so that the light sensing layer operates in a high sensitivity mode so that the light sensing layer can detect the light intensity of light, which is generated by the organic light-emitting layer and reflected by the fingerprint. The light sensing layer recognizes the concavity and convexity of the fingerprint according to the detected light intensity. The terminal recognizes the image of the fingerprint according to the light intensity fed back by the light sensing layer on the display panel. Then the terminal determines whether the user has permission to launch the application or not according to types of the running application and fingerprint database stored in the terminal. In the step 24, when the running application does not require fingerprint recognition, the terminal makes the light sensing layer to operate at a low sensitivity mode. The light sensing layer only needs to detect whether a reflected light is received instead of the intensity of the reflected light. The terminal obtains the position of a touch or a movement of the touch according to the feedback result of the light sensing layer of the display panel, so that the user can control the terminal by touching However, if the terminal keeps acquiring which type the running application of the display panel is, the load on the processor is increased. For example, if the display panel is playing a video or in a standby mode, the user does not need fingerprint recognition in this situation. Thus, the terminal does not need to acquire the type of the running application of the display panel. Or, when the running application requires fingerprint recognition, but the screen of terminal is shut down for a standby mode or the user does not have any actions. If the light sensing layer continuously operates in a high sensitivity mode in this situation, power consumption of the terminal will be rapidly increased.

Figure 3:
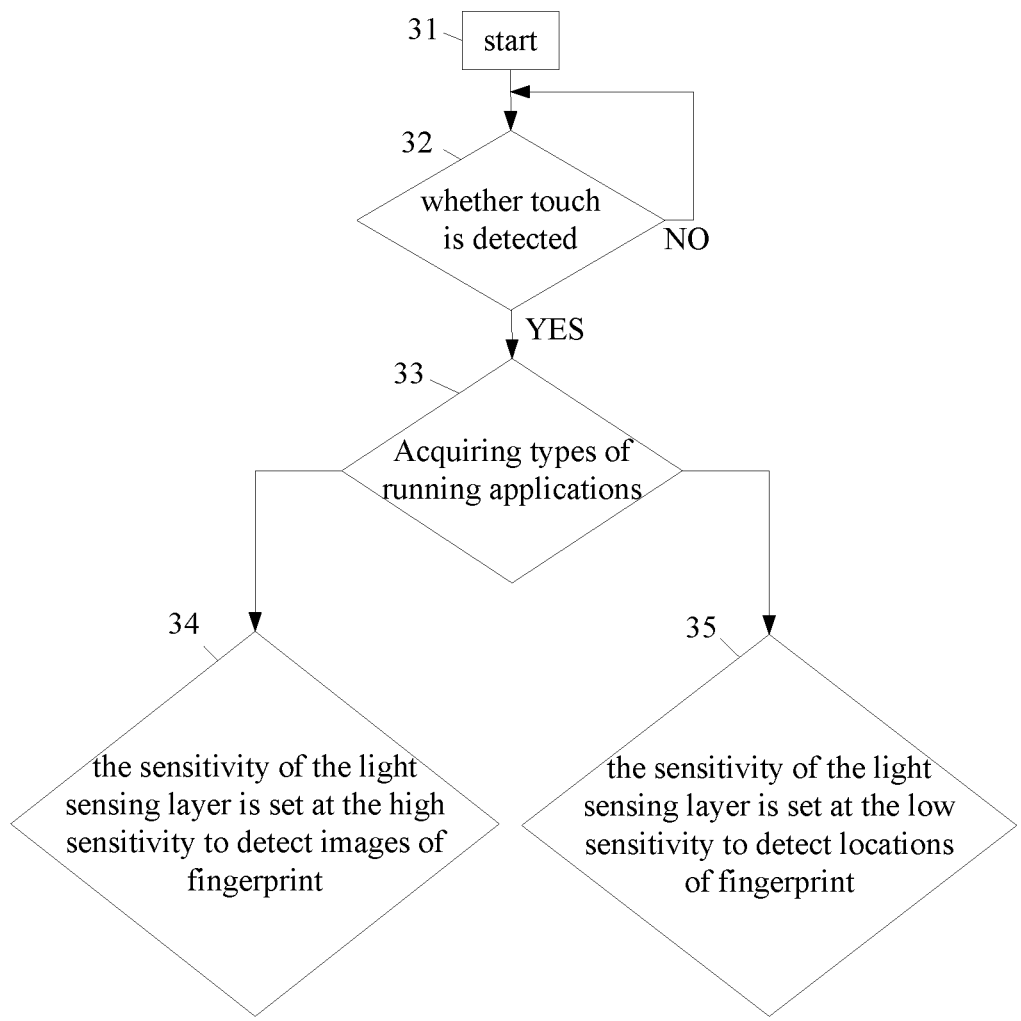
FIG. 3 illustrates a flow chart of the fingerprint sensing display panel of a second embodiment of the present disclosure.

Therefore, the present disclosure further provides a second embodiment. FIG. 3 is a flow chart of the fingerprint sensing display panel of a second embodiment of the present disclosure. In a step 31, a terminal having the fingerprint sensing display panel of the present disclosure starts launching and displaying images according to running applications or user instructions. Differing from the first embodiment, the second embodiment firstly determines whether a touch is detected on the display panel or not, that is, detecting whether the light sensing layer receives the reflected light or not. If the light sensing layer receives the reflected light, it means that the user is using the terminal, then a step 33 is performed to determine whether the running application of the display panel requires fingerprint recognition or not. If the running application requires fingerprint recognition, a step 34 is performed. If the running application does not require fingerprint recognition, a step 35 is performed. In the step 34, when the running application requires fingerprint recognition, the terminal raises the sensitivity of the light sensing layer, so that the light sensing layer operates in a high sensitivity mode. As a result, the terminal can determine whether the user has permission to launch the application or not according to types of the running application and fingerprint database stored in the terminal. In the step 34, if the running application does not need fingerprint recognition, the terminal makes the light sensing layer to operate in a low sensitivity mode, so that the terminal can obtain the position where touch occurs or touch movement of the finger according to the feedback result detected by the light sensing layer of the display panel so that the user can control the terminal by touching The second embodiment detects the running application of the display panel only when the finger is detected placing on the display panel. That is, when the screen does not receive any gesture control in certain situations, such as the terminal in an idle mode, in a standby mode, playing video, etc., the terminal does not need to acquire the type of the running application of the display panel so that the sensitivity of the light sensing layer does not require adjusting. Therefore, in comparison with the first embodiment, power consumption of the second embodiment of the fingerprint sensing display panel of the present disclosure is more efficient while the light-sensing layer can still perform sensitivity adjustment according to the running application of the display panel.

By utilizing the fingerprint sensing display panel and the fingerprint sensing method of the present disclosure, the display panel can perform fingerprint recognition without extra fingerprint components. In addition, fingerprint recognition implemented in the display area can be achieved so that the users can perform fingerprint recognition on any parts of the display panel rather than perform fingerprint recognition in a block installed fingerprint recognition component. As a result, the user experience is improved. The above-mentioned context only describes preferred embodiments of the present disclosure. It should be noted that a skilled in the art can obtain improvements or modifications without departing from the principles of the present disclosure. Those improvements and modifications should also be considered as protection of the present disclosure.

What I claim is:
1. A fingerprint sensing display panel, comprising:
a flexible substrate;
a light sensing layer disposed on the flexible substrate and configured to adjust sensitivity of the light sensing layer according to a running application, wherein the sensitivity of the light sensing layer is set at a first sensitivity when the running application requires fingerprint image sensing;
a thin film transistor layer disposed on the light sensing layer;
an organic light-emitting layer disposed on the thin film transistor layer and configured to generate light according to emitting signal from the thin film transistor layer; and
a thin film encapsulation layer disposed on the organic light-emitting layer and configured to protect the organic light-emitting layer;
in response to finger on thin film encapsulation layer, the light sensing layer detects light generated from the organic light emitting layer and reflected by the finger;
when the sensitivity of the light sensing layer is set at the first sensitivity, the light sensing layer detects concave and convex of the finger;
when the sensitivity of the light sensing layer is set at a second sensitivity, the light sensing layer detects a location of the finger on thin film encapsulation layer.

2. A fingerprint sensing display panel comprising:
a flexible substrate;
a light sensing layer disposed on the flexible substrate;
a thin film transistor layer disposed on the light sensing layer;
an organic light-emitting layer disposed on the thin film transistor layer and configured to generate light according to emitting signal from the thin film transistor layer; and
a thin film encapsulation layer disposed on the organic light-emitting layer and configured to protect the organic light-emitting layer;
when a user puts a finger on thin film encapsulation layer, the light sensing layer detects lights generated from the organic light-emitting layer and reflected by the finger, and
wherein sensitivity of the light sensing layer is adjusted according to a running application, the sensitivity of the light sensing layer is set at a first sensitivity when the running application requires fingerprint image sensing, and the sensitivity of the light sensing layer is set at a second sensitivity when the running application requires touch location sensing.

3. The fingerprint sensing display panel according to claim 2, when the sensitivity of the light sensing layer is set at the first sensitivity, the light sensing layer detects concavity and convexity of the finger.

4. The fingerprint sensing display panel according to claim 2, when the sensitivity of the light sensing layer is set at the second sensitivity, the light sensing layer detects a location of the finger.

5. A fingerprint sensing method utilized on a fingerprint sensing display panel comprising a light sensing layer, an organic light-emitting layer, and a thin film encapsulation layer, comprising:
step one: determining a running application requiring a fingerprint image or touch location of the fingerprint sensing display panel;
step two: adjusting sensitivity of the light sensing layer according to the running application;
step three: detecting intensity of lights generated from the organic light-emitting layer, penetrating through the thin film encapsulation layer, and reflected from a finger of a user, wherein the light sensing layer detecting an image of the finger putting on the thin film encapsulation layer when the sensitivity of the light sensing layer is set at a first sensitivity, the light sensing layer detecting a location of the finger putting on the thin film encapsulation layer display panel when the sensitivity of the light sensing layer is set at a second sensitivity.

6. The fingerprint sensing method according to claim 5, wherein the sensitivity of the light sensing layer is set at the first sensitivity if the running application requires fingerprint image detections, the sensitivity of the light sensing layer is set at the second sensitivity if the running application requires finger location detections.

7. The fingerprint sensing method according to claim 6, when the sensitivity of the light sensing layer is set at the first sensitivity, the light sensing layer detects concavity and convexity of the finger of the user according to the intensity of the lights reflected from the finger.

8. The fingerprint sensing method according to claim 6, when the sensitivity of the light sensing layer is set at the second sensitivity, the light sensing layer detects the location of the finger of the user according to the light reflected from the finger.

9. The fingerprint sensing method according to claim 6, wherein the step one further comprises detecting whether the user puts the finger on the thin film encapsulation layer, determining a running application requiring a fingerprint image or touch location of the fingerprint sensing display panel if the finger is detected on the thin film encapsulation layer, the sensitivity of the light sensing layer is set at the second sensitivity if the finger is not detected on the thin film encapsulation layer.

* * * * *